United States Patent
An et al.

(10) Patent No.: US 9,812,510 B1
(45) Date of Patent: Nov. 7, 2017

(54) PACKAGING ORGANIC PHOTODETECTORS

(71) Applicant: General Electric Company, Schenectady, NY (US)

(72) Inventors: Kwang Hyup An, Rexford, NY (US); Jie Jerry Liu, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 15/378,948

(22) Filed: Dec. 14, 2016

(51) Int. Cl.
*H01L 27/30* (2006.01)
*H01L 51/44* (2006.01)

(52) U.S. Cl.
CPC .......... *H01L 27/308* (2013.01); *H01L 51/448* (2013.01)

(58) Field of Classification Search
CPC ............................ H01L 27/308; H01L 51/448
See application file for complete search history.

(56) References Cited

U.S. PATENT DOCUMENTS

| | | | |
|---|---|---|---|
| 5,324,947 A | 6/1994 | Watanabe | |
| 6,359,282 B1 * | 3/2002 | Sekela | G01T 1/20 250/363.02 |
| 6,414,316 B1 | 7/2002 | Maydanich et al. | |
| 6,455,855 B1 | 9/2002 | Kwasnick et al. | |
| 6,720,561 B2 | 4/2004 | Baumgartner et al. | |
| 7,473,903 B2 | 1/2009 | DeJule et al. | |
| 8,415,628 B1 | 4/2013 | Shaw et al. | |
| 2003/0127600 A1 | 7/2003 | Vafi et al. | |
| 2007/0114429 A1 | 5/2007 | Bhadare | |
| 2007/0158574 A1 | 7/2007 | Petrillo et al. | |
| 2015/0144889 A1 * | 5/2015 | An | G01T 1/2018 257/40 |
| 2016/0077221 A1 | 3/2016 | Liu et al. | |

FOREIGN PATENT DOCUMENTS

| | | |
|---|---|---|
| CN | 202041646 U | 11/2011 |
| CN | 204347266 U | 5/2015 |

* cited by examiner

*Primary Examiner* — Karen Kusumakar
(74) *Attorney, Agent, or Firm* — Pabitra K. Chakrabarti

(57) ABSTRACT

A method for packaging an organic photodetector includes providing a multilayer structure disposed on a portion of a substrate to form the organic photodetector; providing a casing having at least one wall and an open end, wherein the casing includes at least one aperture in at least one wall; sealing the open end of the casing with the substrate to enclose the multilayer structure in a volume such that the least one aperture is located in a path of radiation to an inactive region of the organic photodetector; evacuating the volume through the at least one aperture; and closing the at least one aperture after evacuating the volume to form a detector package. The multilayer structure includes a thin film transistor (TFT) array, an organic photodiode disposed on the TFT array, and a scintillator layer disposed on the organic photodiode. An imaging system including the detector package is also presented.

11 Claims, 9 Drawing Sheets

PACKAGING ORGANIC PHOTODETECTORS

BACKGROUND

Embodiments of the present disclosure generally relate to organic photodetectors. More particularly, embodiments of the present disclosure relate to methods for packaging organic photodetectors such as organic x-ray detectors.

Digital x-ray detectors fabricated with continuous photodiodes have potential applications for low cost digital radiography as well as for rugged, light-weight and portable detectors. These x-ray detectors generally include an imager device having an organic photodiode, and a scintillator that converts x-ray to visible light disposed on top of the organic photodiode. Such organic x-ray detectors usually have an increased fill factor and potentially higher quantum efficiency.

One of the technical challenges for organic x-ray detectors is reliability. Organic x-ray detectors are often subject to performance degradation upon exposure to oxygen and/or moisture because of increased dark current in the organic photodiodes and subsequently increased number of defect pixels. Adding barrier films directly atop the organic photodiode may be an effective way to improve stability of the organic photodiode layers and performance of the organic x-ray detectors. However, it may be difficult to achieve high quality (e.g., pinhole-free) thin barrier films in a practical and cost-effective manner.

Further, the organic x-ray detectors may employ an encapsulation cover such as a glass sheet, a metal film or plate. The encapsulation cover may be hermetically sealed to isolate the organic x-ray detector from the atmospheric oxygen and/or moisture. Further, this encapsulation and sealing may be performed inside an inert environment such as a glovebox filled with nitrogen or an inert gas to avoid any exposure to the atmospheric oxygen and/or moisture. However, it may be desirable to perform the encapsulation and sealing in the ambient environment for process yield and low-cost manufacturing, especially for large area organic x-ray detectors. This may lead to trapped air inside the encapsulation cover in the packaged detectors. The trapped air may attack the organic photodiode through the pinholes in the barrier film degrade the performance of the organic x-ray detectors.

Therefore, there is a need for improved ways for packaging organic photodetectors, for example organic x-ray detectors for forming detector packages.

BRIEF DESCRIPTION

In one aspect of the specification, a method for packaging an organic photodetector includes providing a multilayer structure disposed on a portion of a substrate to form the organic photodetector; providing a casing having at least one wall and an open end, wherein the casing includes at least one aperture in the at least one wall; sealing the open end of the casing with the substrate to enclose the multilayer structure in a volume such that the least one aperture is located in a path of radiation to an inactive region of the organic photodetector; evacuating the volume through the at least one aperture; and closing the at least one aperture after evacuating the volume to form a detector package. The multilayer structure includes a thin film transistor (TFT) array, an organic photodiode disposed on the TFT array, and a scintillator layer disposed on the organic photodiode.

Another aspect presents an imaging system including the detector package.

These and other features, embodiments, and advantages of the present disclosure may be understood more readily by reference to the following detailed description.

DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Figure 1:
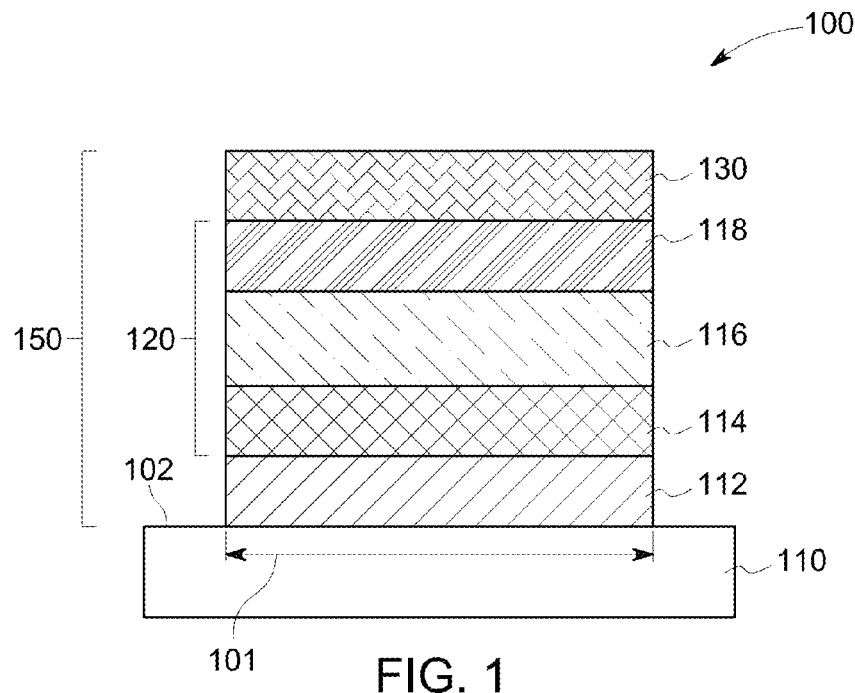
FIG. 1 is a schematic of a cross-sectional view of an organic photodetector, in accordance with one embodiment of the invention.

As discussed in detail below, some of the embodiments of the present disclosure relate to methods for packaging organic photodetectors, for example organic x-ray detectors to form detector packages. More particularly, some embodiments relate to methods that enable packaging of large area organic x-ray detectors using low cost manufacturing processes.

In the following specification and the claims, the singular forms "a", "an" and "the" include plural referents unless the context clearly dictates otherwise. As used herein, the term "or" is not meant to be exclusive and refers to at least one of the referenced components being present and includes instances in which a combination of the referenced components may be present, unless the context clearly dictates otherwise.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

Unless defined otherwise, technical and scientific terms used herein have the same meaning as is commonly understood by one of skill in the art to which this invention belongs. The terms "comprising," "including," and "having" are intended to be inclusive, and mean that there may be additional elements other than the listed elements. The terms "first", "second", and the like, as used herein do not denote any order, quantity, or importance, but rather are used to distinguish one element from another.

As used herein, the term "layer" refers to a material disposed on at least a portion of an underlying surface in a continuous or discontinuous manner. Further, the term "layer" does not necessarily mean a uniform thickness of the disposed material, and the disposed material may have a uniform or a variable thickness. As used herein, the term "disposed on" refers to layers disposed directly in contact with each other or indirectly by having intervening layers there between, unless otherwise specifically indicated.

In the present disclosure, when a layer is being described as "on" another layer or substrate, it is to be understood that the layers can either be directly contacting each other or have one (or more) layer or feature between the layers. Further, the term "on" describes the relative position of the layers to each other and does not necessarily mean "on top of" since the relative position above or below depends upon the orientation of the device to the viewer. Moreover, the use of "top," "bottom," "above," "below," and variations of these terms is made for convenience, and does not require any particular orientation of the components unless otherwise stated.

As used herein, the terms "photoactive layer" and "organic photoactive layer" refer to an organic layer that is capable of generating electric charges in response to or controlled by incident electromagnetic radiation. A device that includes an organic photoactive layer may be referred to as an organic photoactive device. In some embodiments, the organic photoactive layer may be a bulk, hetero-junction organic photodiode layer that absorbs light, generates photoexcited charges that is, excitons (electron-hole pairs), separates the charges (holes and electrons) upon exciton dissociation, and transports electric charge to the opposing contact layers (electrode layers). In some embodiments, the organic photoactive layer comprises a donor material and an acceptor material.

Some embodiments of the present disclosure are directed to a method for packaging an organic photodetector such as, but not limited to, an organic x-ray detector. The method includes providing a multilayer structure disposed on a portion of a substrate to form the organic photodiode; providing a casing having at least one wall and an open end, wherein the casing includes at least one aperture in the at least one wall; sealing the open end of the casing with the substrate to enclose the multilayer structure in a volume such that the least one aperture is located in a path of radiation to an inactive region of the organic photodetector; evacuating the volume through the at least one aperture; and closing the at least one aperture after evacuating the volume to form a detector package. The multilayer structure includes a thin film transistor (TFT) array, an organic photodiode disposed on the TFT array, and a scintillator layer disposed on the organic photodiode.

Figure 2:
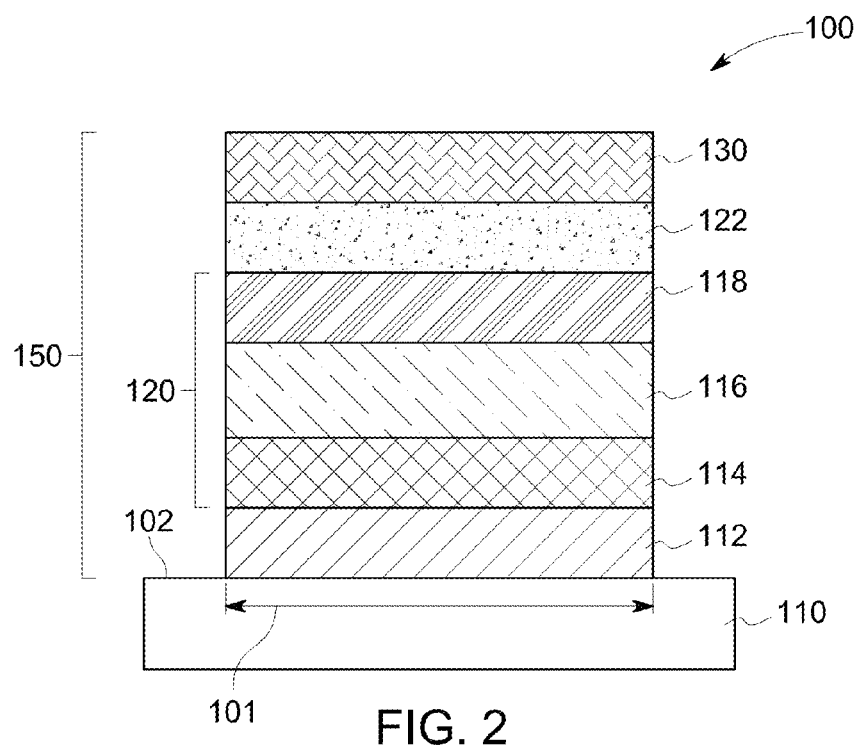
FIG. 2 is a schematic of a cross-sectional view of an organic photodetector, in accordance with one embodiment of the invention.
Figure 3:
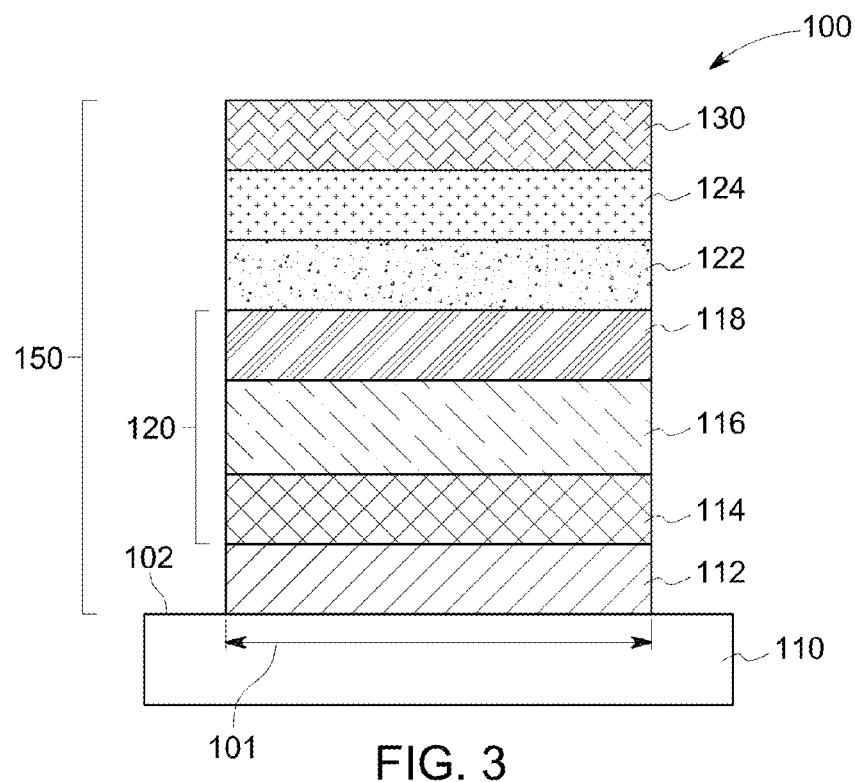
FIG. 3 is a schematic of a cross-sectional view of an organic photodetector, in accordance with one embodiment of the invention.
Figure 4:
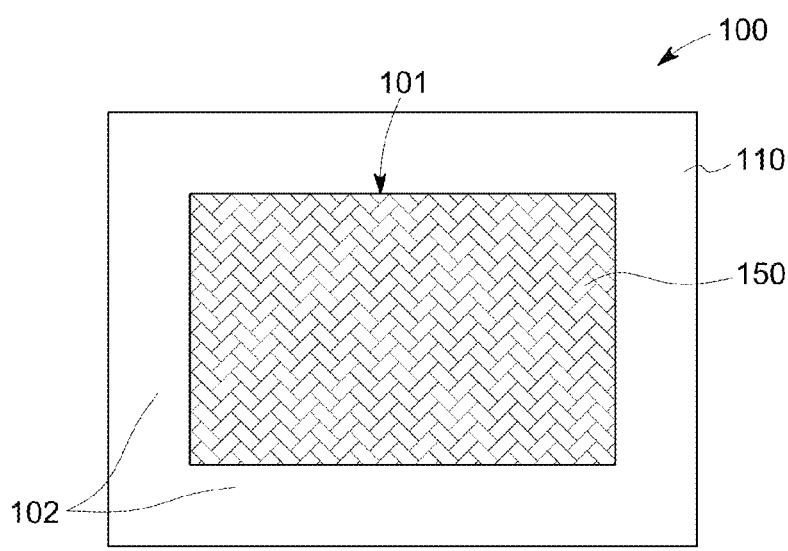
FIG. 4 is a schematic of a top view of an organic photodetector, in accordance with one embodiment of the invention.

In some embodiments, a method for packaging an organic photodetector 100 (FIGS. 1-4) is described. FIGS. 1-3 show schematics of cross-sectional views of the organic photodetector 100, in some embodiments. FIG. 4, in some embodiments, shows a schematic of a top view of the photodetector 100. As illustrated, the organic photodetector 100 includes a substrate 110 and a multilayer structure 150 disposed on a portion 101 of the substrate 110. Referring to FIGS. 1-4, in some embodiments, the multilayer structure 150 is disposed on a portion 101 of the substrate 110 leaving a peripheral portion 102 of the substrate 110 free of the multilayer structure 150.

As depicted in FIGS. 1-3, the multilayer structure 150 includes a thin-film transistor (TFT) array 112, an organic photodiode 120 disposed on the TFT array 112, and a scintillator layer 130 disposed on the organic photodiode 120. The organic photodiode 120 includes a first electrode 114, an organic photoactive layer 116 disposed on the first electrode 114, and a second electrode layer 118 disposed on the organic photoactive layer 116.

The substrate 110 may include a glass, ceramic, plastic, metal or combinations thereof. The substrate 110 may be present as a rigid sheet such as a thick glass, a thick plastic sheet, a thick plastic composite sheet, a metal plate; or a flexible sheet such as a thin glass sheet, a thin plastic sheet, a thin plastic composite sheet, and a metal foil. Suitable examples of materials for the substrate 110 include glass, which may be rigid or flexible; plastics such as polyethylene terephthalate, polybutylene phthalate, polyethylene naphthalate, polystyrene, polycarbonate, polyether sulfone, polyallylate, polyimide, polycycloolefin, norbornene resins, and fluoropolymers; metals such as stainless steel, aluminum, silver and gold; metal oxides such as titanium oxide and zinc oxide; and semiconductors such as silicon. In certain embodiments, the substrate 110 includes a polycarbonate.

The TFT array 112 may be disposed on the portion 101 of the substrate 110. The TFT array 112 may be a two-dimensional array including a plurality of thin film transistors, which stores charge for read out by electronics, disposed on a layer formed of amorphous silicon, polycrystalline silicon, an amorphous metal oxide, or organic semiconductors. In some embodiments, the TFT array 112 includes a silicon TFT array, an oxide TFT array, an organic TFT, or combinations thereof. Suitable examples of the amorphous metal oxides include zinc oxide, zinc tin oxide, indium oxides, indium zinc oxides (In—Zn—O series), indium gallium oxides, gallium zinc oxides, indium silicon zinc oxides, and indium gallium zinc oxides (IGZO). IGZO materials include $InGaO_3(ZnO)_m$, where m is <6 and $InGaZnO_4$. Suitable examples of the organic semiconductors for the TFT array 112 include, but are not limited to, conjugated aromatic materials, such as rubrene, tetracene, pentacene, perylenediimides, tetracyanoquinodimethane and polymeric materials such as polythiophenes, polybenzodithiophenes, polyfluorene, polydiacetylene, poly(2,5-thiophenylene vinylene), poly(p-phenylene vinylene), and derivatives thereof.

The organic photoactive layer 116 may include a blend of a donor material and an acceptor material. In some embodiments, more than one donor material or more than one acceptor material may be included in the blend. Further, the HOMO/LUMO levels of the donor and acceptor materials may be compatible with that of the first and second electrodes (114 and 118) in order to allow efficient charge extraction without creating an energetic barrier. The organic photoactive layer 116 may also referred to as an "absorber layer." In some embodiments, the organic photoactive layer 116 may be patterned.

As used herein, the terms "donor material", "donor phase" and "donor" may be used interchangeably throughout the specification; and the terms "acceptor material", "acceptor phase" and "acceptor" may be used interchangeably throughout the specification.

Suitable donor materials include low bandgap polymers having LUMO ranging from about 1.9 eV to about 4.9 eV and HOMO ranging from about 2.9 eV to about 7 eV. In some embodiments, the donor material has LUMO in a range from 2.5 eV to 4.5 eV, and in certain embodiments, from 3.0 eV to 4.5 eV. In some embodiments, the donor material has HOMO in a range from 4.0 eV to 6 eV, and in certain embodiments, from 4.5 eV to 6 eV. The low band gap polymers include conjugated polymers and copolymers composed of units derived from substituted or unsubstituted monoheterocyclic and polyheterocyclic monomers such as thiophene, fluorene, phenylenevinylene, carbazole, pyrrolopyrrole, and fused heteropolycyclic monomers containing the thiophene ring, including, but not limited to, thienothiophene, benzodithiophene, benzothiadiazole, pyrrolothiophene monomers, and substituted analogs thereof. In some embodiments, the low band gap polymers include units derived from substituted or unsubstituted thienothiophene, benzodithiophene, benzothiadiazole, carbazole, isothianaphthene, pyrrole, benzo-bis(thiadiazole), thienopyrazine, fluorene, thiadiazolequinoxaline, or combinations thereof. In the context of the low band gap polymers described herein, the term "units derived from" means that the units include monoheterocyclic and polyheterocyclic group, without regard to the substituents present before or during the polymerization; for example, "the low band gap polymers include units derived from thienothiophene" means that the low band gap polymers include divalent thienothiophenyl groups. Examples of suitable materials for use as low bandgap polymers in the organic x-ray detectors, in some embodiments, include copolymers derived from substituted or unsubstituted thienothiophene, benzodithiophene, benzothiadiazole, carbazole monomers, or combinations thereof, such as poly[[4,8-bis[(2-ethyl hexyl)oxy]benzo[1,2-b:4,5-b']dithiophene-2,6-diyl][3-fluoro-2-[(2-ethylhexyl)carbonyl] thieno[3,4-b]thiophenediyl (PTB7); 2,1,3-benzothiadiazole-4,7-diyl[4,4-bis(2-ethylhexyl)-4H-cyclopenta[2,1-b:3,4-b']dithiophene-2,6-diyl (PCPDTBT); poly[[9-(1-octylnonyl)-9H-carbazole-2,7-diyl]-2,5-thiophenediyl-2,1,3-benzothiadiazole-4,7-diyl-2,5-thiophenediyl] (PCDTBT); poly[(4,40-bis(2-ethylhexyl)dithieno [3,2-b:20,30-d]silole)-2,6-diyl-alt-(2,1,3-benzo-thiadiazole)-4,7-diyl] (PSBTBT); poly((4,8-bis(octyloxy)benzo(1,2-b:4,5-b')dithiophene-2,6-diyl)(2-((dodecyloxy)carbonyl) thieno(3,4-b)thiophenediyl)) (PTB1); poly((4,8-bis(octyloxy)benzo(1,2-b:4,5-b')dithiophene-2,6-diyl)(2-((ethylhexyloxy)carbonyl) thieno(3,4-b)thiophenediyl)) (PTB2); poly((4,8-bis(octyl) benzo(1,2-b:4,5-b')dithiophene-2,6-diyl) (2-((ethylhexyloxy)carbonyl) thieno(3,4-b)thiophenediyl)) (PTB3); poly ((4,8-bis-(ethylhexyloxybenzo(1,2-b:4,5-b')dithiophene-2,6-diyl)(2-((octyloxy)carbonyl)-3-fluoro)thieno(3,4-b) thiophenediyl)) (PTB4); poly((4,8-bis(ethylhexyloxybenzo(1,2-b:4,5-b')dithiophene-2,6-diyl)(2-((octyloxy)carbonyl) thieno(3,4-b)thiophenediyl)) (PTB5); poly((4,8-bis(octyloxy)benzo(1,2-b:4,5-b')dithiophene-2,6-diyl)(2-((butyloctyloxy)carbonyl) thieno(3,4-b)thiophenediyl)) (PTB6); poly [[5-(2-ethylhexyl)-5,6-dihydro-4,6-dioxo-4H-thieno[3,4-c] pyrrole-1,3-diyl][4,8-bis[(2-ethylhexyl)oxy]benzo [1,2-b:4,5-b']dithiophene-2,6-diyl]](PBDTTPD); poly[1-(6-{4,8-bis[(2-ethylhexyl)oxy]-6-methylbenzo[1,2-b:4,5-b'] dithiophen-2-yl}-3-fluoro-4-methylthieno[3,4-b]thiophen-2-yl)-1-octanone](PBDTTT-CF); or poly[2,1,3-benzothiadiazole-4,7-diyl-2,5-thiophenediyl (9,9-dioctyl-9H-9-silafluorene-2,7-diyl)-2,5-thiophenediyl] (PSiF-DBT). Other suitable materials include poly[5,7-bis (4-decanyl-2-thienyl) thieno[3,4-b]diathiazole-thiophene-2,5] (PDDTT); poly[2,3-bis(4-(2-ethylhexyloxy)phenyl]-5,7-di(thiophen-2-yl)thieno[3,4-b]pyrazine] (PDTTP); or polythieno[3,4-b] thiophene (PTT). In certain embodiments, suitable materials are copolymers derived from substituted or unsubstituted benzodithiophene monomers, such as the PTB1-7 series and PCPDTBT; or benzothiadiazole monomers, such as PCDTBT and PCPDTBT.

Suitable acceptor materials include fullerenes and their derivatives such as [6,6]-phenyl-$C_{61}$-butyric acid methyl ester (PCBM); PCBM analogs such as $PC_{70}BM$, $PC_{71}BM$, $PC_{80}BM$, bis-adducts thereof, such as bis-$PC_{71}BM$, indene mono-adducts thereof, such as indene-$C_{60}$ monoadduct (ICMA) or indene bis-adducts thereof, such as indene-$C_{60}$ bisadduct (ICBA). Other examples of acceptor materials include, but are not limited to, poly[(9,9-dioctylfluorenyl-2,7-diyl)-alt-(4,7-bis(3-hexylthiophen-5-yl)-2,1,3-benzothiadiazole)-2',2''-diyl] (F8TBT) may also be used, alone or with a fullerene derivative.

In one embodiment, the first electrode layer 114 functions as a cathode and the second electrode layer 118 as an anode. In another embodiment, the first electrode layer 114 functions as an anode and the second electrode layer 118 as a cathode. Suitable anode materials include, but are not limited to, metals such as Al, Ag, Au, and Pt; metal oxides such as indium tin oxide (ITO), indium zinc oxide (IZO), and zinc oxide (ZnO); and organic conductors such as p-doped conjugated polymers like PEDOT. Suitable cathode materials include transparent conductive oxides (TCO) and thin films of metals such as gold and silver. Examples of suitable TCO include ITO, IZO, aluminum zinc oxide (AZO), fluorinated tin oxide (FTO), tin oxide ($SnO_2$), titanium dioxide ($TiO_2$), ZnO, indium zinc oxide (In—Zn—O series), indium gallium oxide, gallium zinc oxide, indium silicon zinc oxide, indium gallium zinc oxide, or combinations thereof.

Depending on the application and variations in design, the organic photodiode 120 may further include additional layers. In some embodiments, the organic photodiode 120 may further include one or more charge blocking layers, for example, an electron blocking layer and a hole blocking layer (not shown in Figures). In some embodiments, an electron blocking layer may be disposed between the first electrode layer 114 and the organic photoactive layer 116. In some embodiments, a hole blocking layer may be disposed between the organic photoactive layer 116 and the second electrode layer 118. Further, the organic photodiode 120 may be directly disposed on the TFT array 112 or the design may include one or more layers disposed between the organic photodiode 120 and the TFT array 112.

The scintillator layer 130 may include a phosphor material that is capable of converting incident radiation (to be detected) to visible light. The wavelength region of light emitted by scintillator layer 130 may range from about 360 nanometers (nm) to about 830 nm. Suitable materials for the scintillator layer 130 include, but are not limited to, cesium iodide (CsI), CsI (Tl) (cesium iodide to which thallium has been added), terbium-activated gadolinium oxysulfide (GOS), sodium iodide (NaI), lutetium oxides (for example, $Lu_2O_3$) or combinations thereof. Such materials may be commercially available in the form of a sheet or screen. The scintillator layer 130 can be applied by a deposition technique such as thermal evaporation or lamination. Another example of scintillator layer may be used, is a PIB (particle in binder) scintillator, where scintillating particles may be incorporated in a binder matrix material and flattened on a substrate. The scintillator layer 130 may be a monolithic scintillator or pixelated scintillator array. The visible light generated by the scintillator layer 130 irradiates the organic photodiode 120 disposed on the TFT array 112. In some embodiments, the scintillator layer 130 is excited by impinging x-ray radiation, and produces visible light.

In some embodiments, the organic photodetector 100 may further include one or more layers disposed on the second electrode layer 118, for example a planarization layer and a barrier layer. FIG. 2 illustrates an embodiment of an organic photodetector 100 wherein a planarization layer 122 is interposed between the second electrode layer 118 and the scintillator layer 130. Non-limiting examples of materials for the planarization layer 122 include a polyimide, an acrylate, or a low solvent content silicone. The planarization layer 122 may provide a smooth surface prior to the deposition of the scintillator layer 130.

In some embodiments, a barrier layer 124 (or protective layer) may be disposed between the second electrode layer 118 and the scintillator layer 130. As shown in FIG. 3, in some embodiments, the barrier layer 124 is disposed between the planarization layer 122 and the scintillator layer 130. In some embodiment, the barrier layer 124 may include an inorganic material. In some embodiments, the barrier layer 124 may include silicon, a metal oxide, a metal nitride, or combinations thereof, where the metal is one of indium, tin, zinc, titanium, and aluminum. Non-limiting examples of metal nitrides and metal oxides include indium zinc oxide (IZO), indium tin oxide (ITO), silicon oxide, silicon nitride, silicon oxynitride, aluminum oxide, aluminum oxynitride, zinc oxide, indium oxide, tin oxide, cadmium tin oxide, cadmium oxide, magnesium oxide, or combinations thereof.

Figure 5:
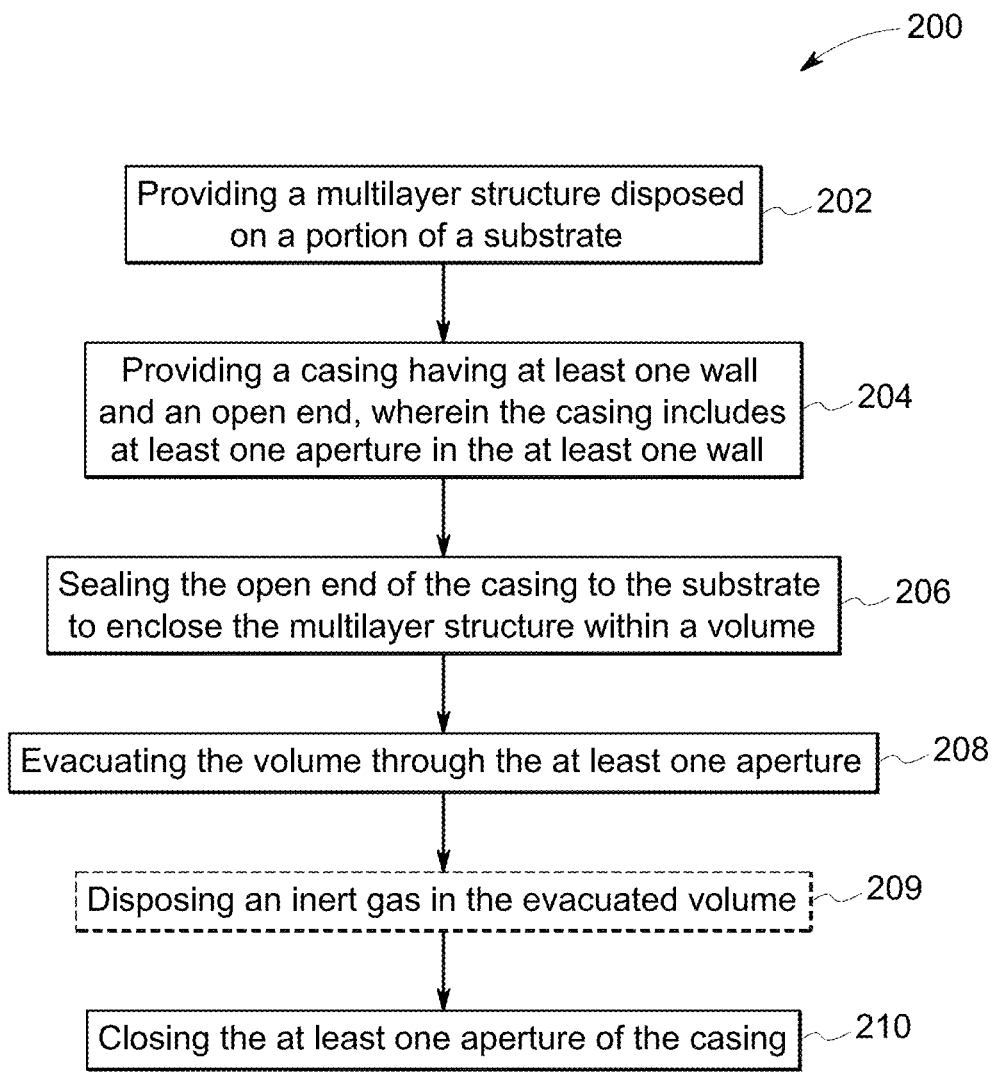
FIG. 5 is flow chart of a method for packaging an organic photodetector, in accordance with one embodiment of the invention.

In certain embodiments, a method for packaging an organic photodetector (for example, the organic photodetector 100 as shown in FIGS. 1-4) is described with reference to FIGS. 5-12. FIG. 5 shows a flow chart of a method 200 for packaging an organic photodetector, according to some embodiments. In some embodiments, the organic photodetector 100 is an organic x-ray detector. The organic x-ray detector may be packaged by the method, as described herein.

Referring to FIGS. 1-5, in some embodiments, the method 200 includes the step 202 of providing a multilayered structure 150 disposed on a portion 101 of a substrate 110. In some embodiments, the step 202 of providing the multilayer structure 150 includes disposing a TFT array 112 on the portion 101 of the substrate 110, disposing a first electrode layer 114 on a TFT array 112 by any suitable technique, such as sputtering, vapor deposition, or e-beam deposition. The step 202 further includes disposing an organic photoactive layer 116 on the first electrode layer 114. In some embodiments, an optional electron blocking layer (not shown in Figures) may be deposited on the first electrode layer 114 followed by disposing the organic photoactive layer 116 on the electron blocking layer. The organic photoactive layer 116 may be disposed using any suitable method, for example solution based deposition methods followed by curing. The step 202 further includes disposing a second electrode layer 118 on the organic photoactive layer 116. The second electrode layer 118 may be disposed by a suitable deposition technique, such as thermal evaporation, sputtering and direct printing. In some embodiments, the step 202 may include disposing a hole blocking layer (not shown in Figures) on the organic photoactive layer 116 followed by disposing the second electrode layer 118 on the hole blocking layer. Further, the step 202 includes disposing a scintillator layer 130 on the second electrode layer 118, and thereby forming the multilayer structure 150 on the substrate 110. The scintillator layer 130 may be disposed by depositing a suitable scintillator material on the second electrode layer 118 or by providing a suitable scintillator sheet. In some embodiments, at least one of the planarization layer 122 or the barrier layer 124 is disposed on the second electrode layer 118 prior to disposing the scintillator layer 130.

The method 200 further includes the step 204 of providing a casing having at least one wall and an open end. The casing includes at least one aperture in the at least one wall. The at least one aperture may be at a position in the casing such that after enclosing the multilayer structure within a volume by sealing the open end of the casing to the substrate, the aperture is located in a path of radiation to an inactive region of the organic photodetector.

Figure 6:
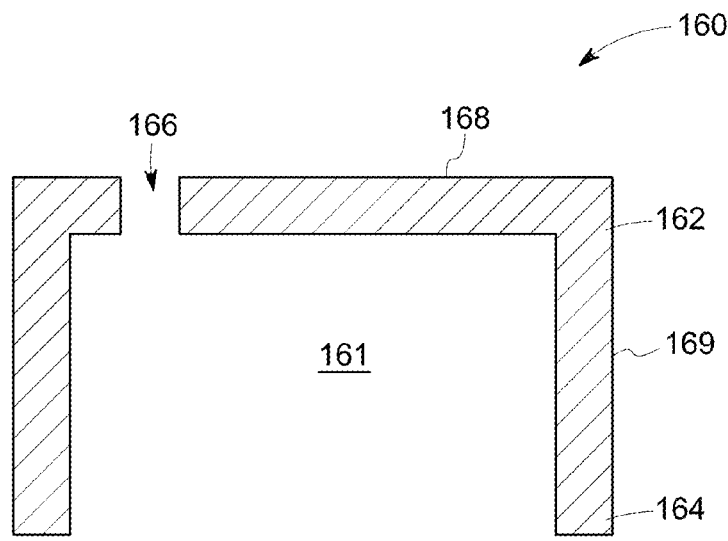
FIG. 6 is a schematic of a cross-sectional view of a casing, in accordance with one embodiment of the invention.
Figure 7:
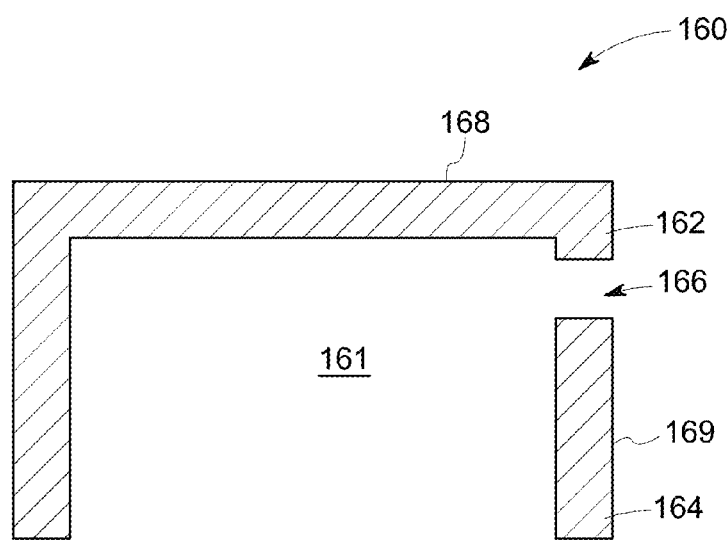
FIG. 7 is a schematic of a cross-sectional view of a casing, in accordance with one embodiment of the invention.
Figure 8:
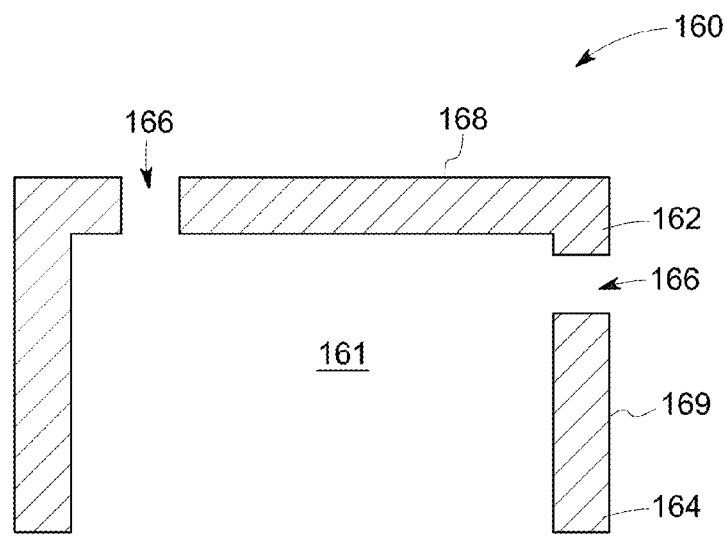
FIG. 8 is a schematic of a cross-sectional view of a casing, in accordance with one embodiment of the invention.

FIGS. 6, 7, and 8 illustrate schematics of a casing 160, in some embodiments. Vertical cross sectional views of the casing 160 are depicted in FIGS. 6-8. The casing 160 may be cylindrical, tubular, or cup shaped, with a close end 162 and an open end 164. In certain embodiments, the casing 160 may resemble a box with an open end 164. The open end 164 of the casing 160 may be sealable. The casing 160 may have any suitable shape to have a cross-sectional profile that is square, polygonal, oval or ellipse, or circle, for example. The casing 160 may have a depth and width that define a volume 161 suitable to cover the multilayer structure 150.

The casing 160 may be radiation transmissive, and may allow an incident radiation to reach the multilayer structure 150 with negligible (less than 1 percent) absorption or scattering. The casing 160 may be formed from a material that have a low degree of x-ray attenuation for example, less than 5%, a coefficient of thermal expansion matching with the coefficient of thermal expansion of the substrate 110 and can provide structural integrity. Suitable examples of the materials for the casing 160 may include glasses, metals, ceramics, composites, or combinations thereof. In certain embodiments, the casing 160 and the substrate 110 are made of same material.

As noted, the casing 160 may include an aperture in at least one wall. As illustrated in FIG. 6, the casing 160 may include an aperture 166 in a top wall 168 of the casing 160. In some embodiments, the casing 160 includes the aperture 166 in a side wall 169 of the casing 160 as illustrated in FIG. 7. Further, in some embodiments, the casing 160 may have two apertures in the at least one wall of the casing 160. For example, the casing 160 may have one aperture located in the top wall 168 and the other aperture in the side wall 169 of the casing 160, as shown in FIG. 8. The aperture(s) 166 may be of any shape having an area less than 1.0 $mm^2$. The shape and size of the aperture can be chosen such that the aperture 166 and its sealing may not affect the desirable radiation to reach the active regions of the organic photodetector.

Referring to FIG. 5, the method 200 includes the step 206 of sealing the open end of the casing to the substrate to enclose the multilayer structure within a volume. While enclosing the multilayer structure, the casing is arranged such that the at least one aperture is located in a path of radiation to an inactive region of the organic photodetector.

As used herein, the term "inactive region" refers to a region of an organic photodetector that is free of active pixels for the conversion of photons to electrons. The active pixels generally include a TFT, a photodiode disposed on the TFT and a capacitor. The regions of the organic photodetector including the active pixels refer to active regions. In some embodiments, the inactive region is free of any electronics such as data lines, scan lines, application-specific integrated circuit (ASIC) module. Further, the inactive region is free of a metal pad to connect ASIC module to data lines, in some embodiments. Referring to FIGS. 1-4, in one embodiment, the portion 102 of the substrate 110, which is free of multilayer structure 150 includes an inactive region of the organic photodetector 100.

Figure 9:
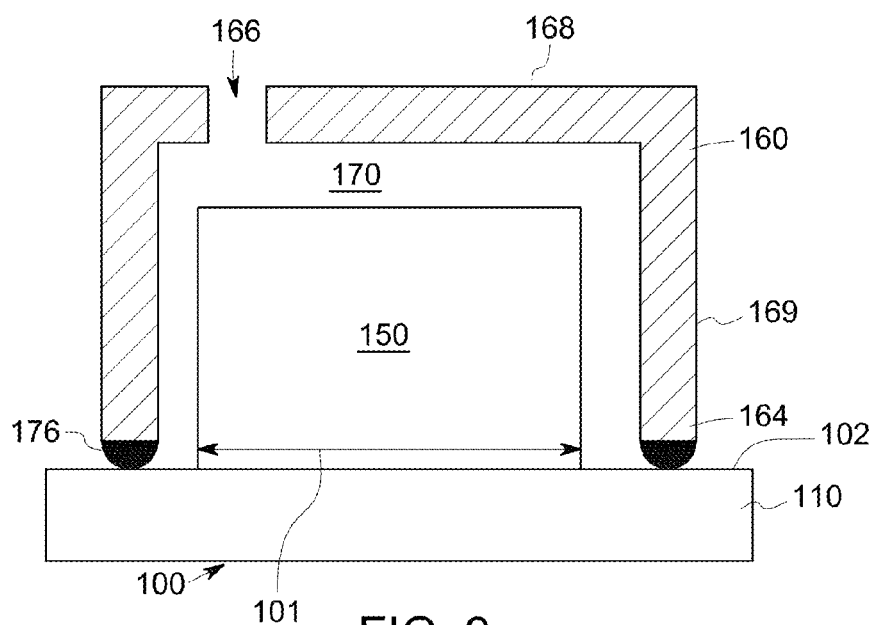
FIG. 9 is a schematic representation of a method step of the method of FIG. 5, in accordance with one embodiment of the invention.
Figure 10:
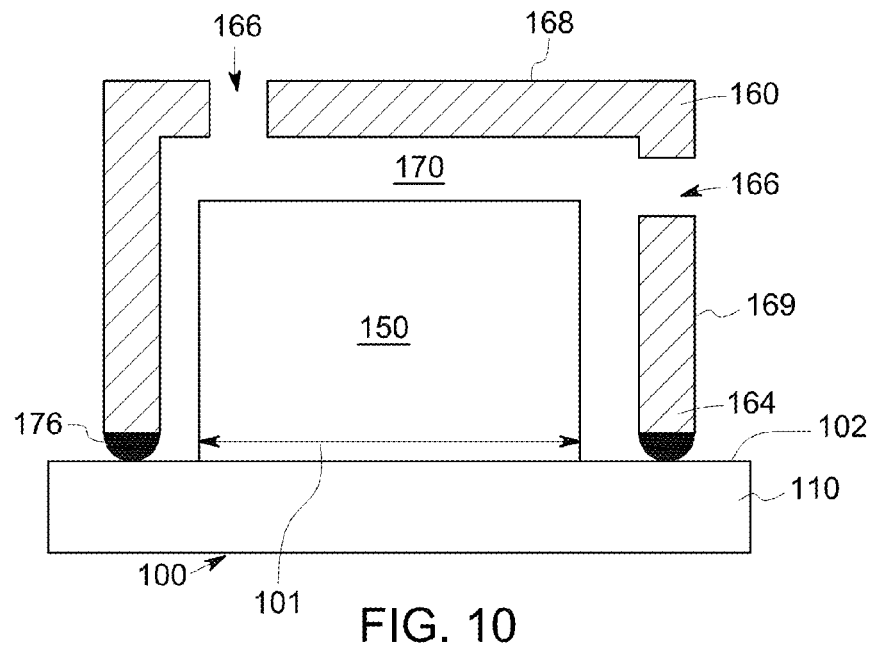
FIG. 10 is a schematic representation of a method step of the method of FIG. 5, in accordance with one embodiment of the invention.

In some embodiments, referring to FIGS. 5, 9 and 10, the step 206 includes sealing the open end 164 of the casing 160 to the peripheral portion 102 of the substrate 110 to enclose the multilayer structure 150 within a volume 170. While enclosing the multilayer structure 150, the casing 160 is arranged such that the at least one aperture 166 is located in a path of radiation to an inactive region (not shown in Figures) of the organic photodetector 100.

In some embodiments, the sealing is performed by bonding the open end 164 of the casing 160 to the peripheral portion 102 of the substrate 110, which is free of the multilayer structure 150. In some embodiments, the open end 164 of the casing 160 is sealed to the peripheral portion 102 of the substrate 110 in a continuous manner around the multilayer structure 150. That is, the casing 160 is hermetically sealed to the substrate 110 without any leakage at the sealing joints of the casing 160 and the substrate 110. In some embodiments, the open end 164 of the casing 160 is sealed to the substrate 110 in the inactive region of the organic photodetector 100.

The sealing may be performed by bonding the open end 164 of the casing 160 to the substrate 110 using a sealant 176. The sealant 176 may include an encapsulant material selected from the group consisting of a low temperature glass, a low temperature metal or metal alloy, a polymeric material, and combinations thereof. Suitable examples of the low temperature metal alloys include tin-lead, tin-silver-copper. Examples of polymeric materials may include epoxies, acrylates or combinations thereof. In one embodiment, the sealant 176 is curable. In some embodiments, the sealant 176 is moisture-resistant encapsulant material such as an epoxy.

While sealing a casing to a substrate to enclose a multilayer structure within a volume, as described herein, the casing is arranged such that at least one aperture is located in a path of radiation to an inactive region of an organic photodetector. Such arrangement of the casing may not obstruct the path of radiation to an active region (that includes the multilayer structure) of the organic photodetector, and may allow the desired radiation to reach the active region to maintain the efficiency of the organic photodetector.

Continuing referring to FIGS. 5, 9 and 10, after sealing step 206, the method 200 further includes the step 208 of evacuating the volume 170 through the at least one aperture 166. In some embodiments, the evacuation of the volume 170 is performed by a vacuum pump. The vacuum pump may be connected to the volume 170 through the at least one aperture 166. In some embodiments, the volume 170 is evacuated to a vacuum level less than 1 Torr. In some embodiments, the evacuation step 208 includes removing trapped air in the volume 170 while enclosing the multilayer structure 150 in the volume 170 (i.e., while packaging the multilayer structure 150 inside the casing 160).

After evacuating the volume 170, the method 200 may further include the optional step 209 of disposing an inert gas in the evacuated volume through the at least one aperture 166. In some embodiments, the step 208 of evacuating the volume 170 may be performed simultaneously with the step 209 of disposing the inert gas into the evacuated volume. For example, referring to FIG. 9, the evacuation step 208 may be carried out through one aperture 166 at the top wall 168 of the casing 160 and the step 209 of disposing of the inert gas into the volume 170 is carried out through another aperture 166 on the side wall 169 of the casing 160 simultaneously.

Figure 11:
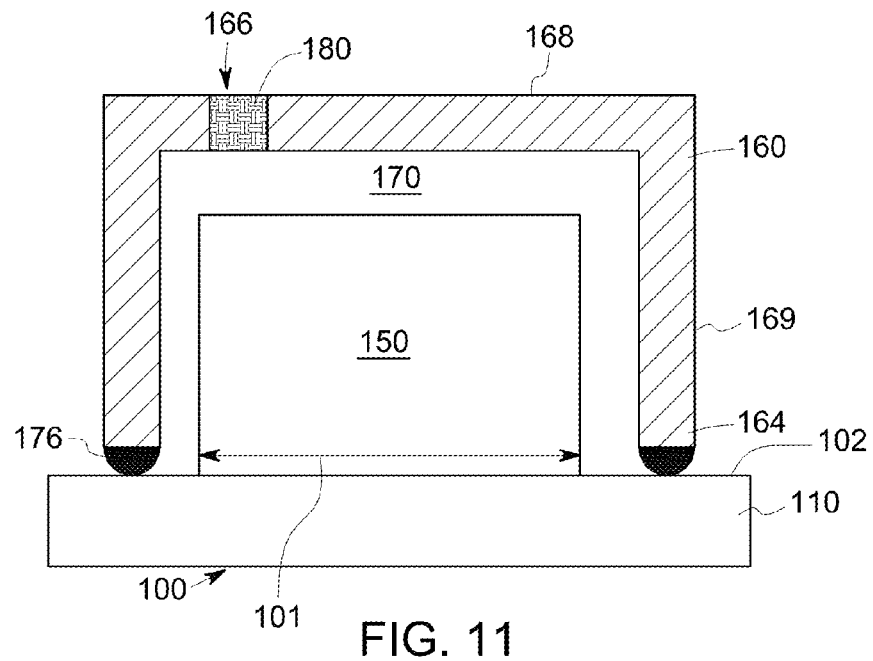
FIG. 11 is a schematic of a detector package, in accordance with one embodiment of the invention.
Figure 12:
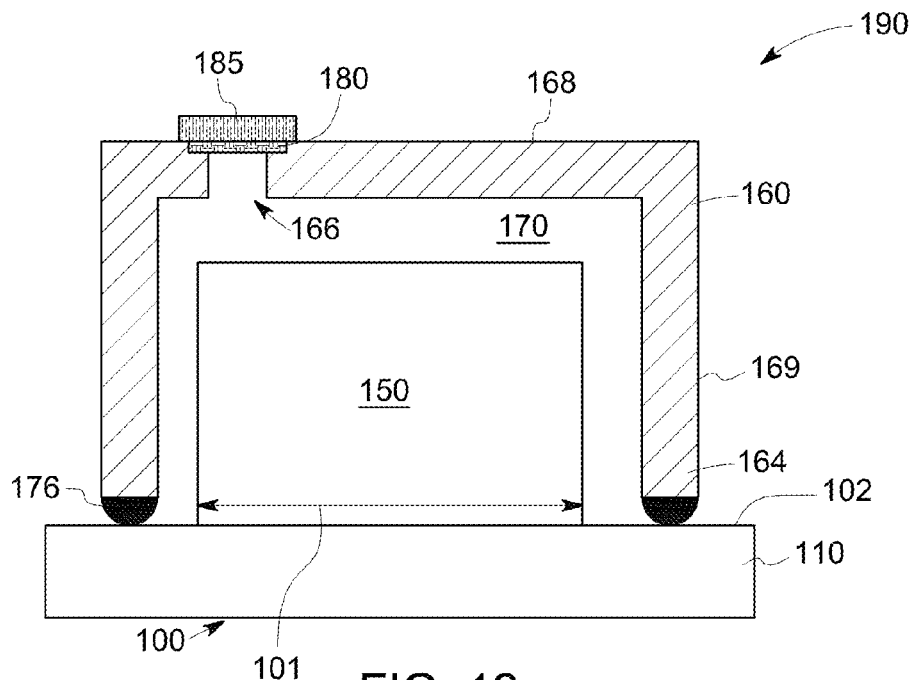
FIG. 12 is a schematic of a detector package, in accordance with one embodiment of the invention.
Figure 13:
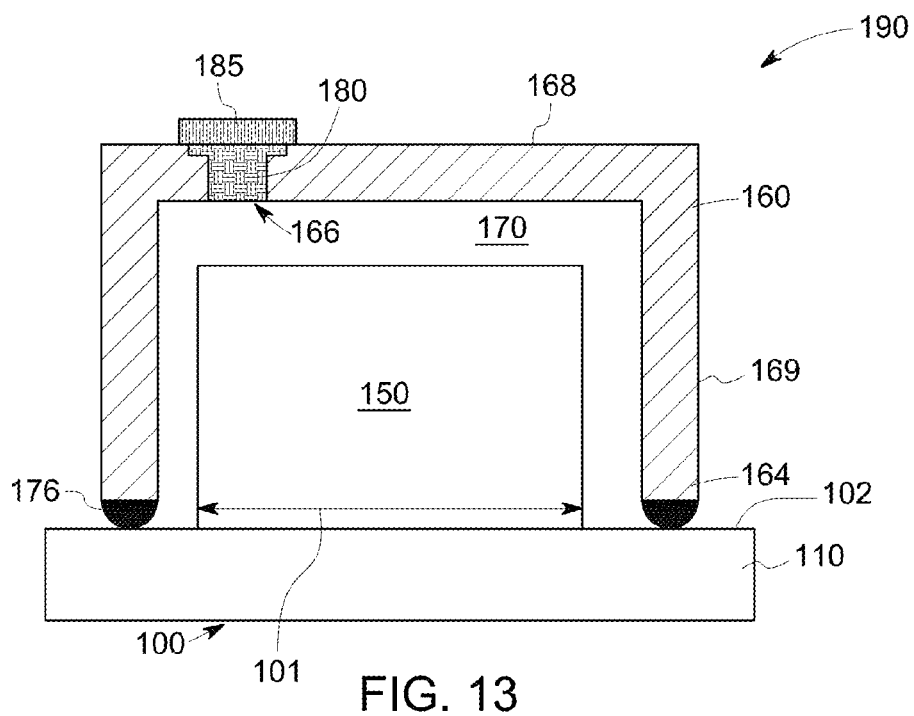
FIG. 13 is a schematic of a detector package, in accordance with one embodiment of the invention.

After completing the evacuation step 208, the method 200 includes the step 210 of closing the at least one aperture 166. In embodiments where the casing 160 includes two apertures 166, the method step 210 includes closing the two apertures 166. This closing may include hermitically sealing the aperture(s) 166 using a cover, a sealant, or a combination thereof. In some embodiments, the closing of the aperture 166 can be performed by filling the aperture 166 with a sealant 180 as shown in FIG. 11. In some embodiments, the closing step 210 includes using a cover 185 to close the aperture 166, as shown in FIGS. 12 and 13. The cover 185 may be formed of any solid material that is oxygen and moisture resistant. Suitable examples include, but are not limited to, glass, metal, composite or combinations thereof. The cover 185 can be sealed using the sealant 180 (sealant materials are described above) to hermetically seal the aperture(s) 166. In some embodiments, the cover 185 can be sealed using laser ablation to hermetically seal the aperture(s) 166. In embodiments where the casing 160 includes two apertures 166, the closing step 210 includes closing the two apertures 166 using the sealant 180 and/or the cover 185. After closing the aperture(s) 166, the method 200 forms a detector package 190 as shown in FIGS. 11-13.

A detector package according to embodiments of the present disclosure may be used in imaging systems. Several examples of imaging applications include security imaging, medical imaging, industrial and military imaging for pipelines, fuselage, airframe and other tight access areas.

Figure 14:
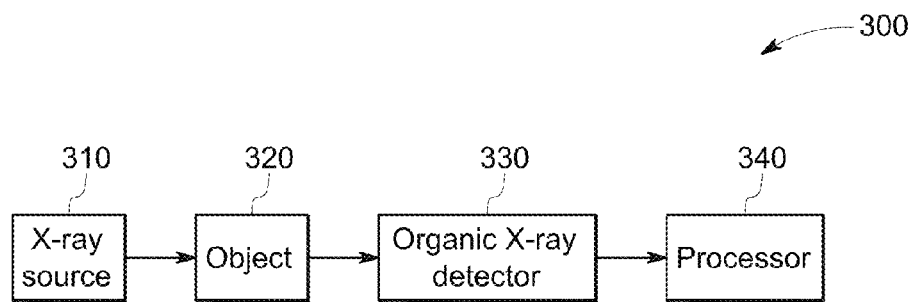
FIG. 14 is a schematic of an imaging system, in accordance with one embodiment of the invention.

Some embodiments are directed to an imaging system. In some embodiments, the imaging system is an x-ray imaging system. FIG. 14 shows a schematic of an x-ray imaging system 300 that includes an x-ray source 310 configured to irradiate an object 320 with x-ray radiation, a detector package 330 including an organic x-ray detector packaged by the process as described herein, and a processor 340 operable to process data from the organic x-ray detector.

EXAMPLES

Organic x-ray detector (OXRD) imagers were fabricated, packaged and tested as described below. OXRD imagers were fabricated using same materials for several layers in each OXRD imager.

Fabrication of OXRD Imager

A thin film transistor (TFT) substrate having a TFT array pre-coated with an indium titanium oxide (ITO) anode layer was disposed on a middle portion of a glass substrate leaving a peripheral portion of the substrate. The ITO anode layer was connected to a source and a drain of the TFT. A proprietary charge blocking layer was coated atop the ITO anode layer of the TFT substrate. An organic photoactive layer including a blend of a fullerene and a donor polymer was then deposited onto the charge blocking layer inside a $N_2$ purged glove box. An ITO cathode layer was deposited by sputtering on the photoactive layer. A barrier layer was then disposed on the ITO cathode.

Example 1: Packaging an OXRD Imager without a Casing

An OXRD imager fabricated as explained above was packaged without using a casing. That means the OXRD imager was directly (without any casing) exposed to atmospheric oxygen and moisture.

Example 2: Packaging an OXRD Imager in a Casing without Evacuation

An OXRD imager fabricated as explained above was packaged by enclosing the OXRD imager using a glass casing having an open end (similar to as shown in FIG. 6, and that did not have any aperture in any wall of the glass casing). The peripheral edges of the open end of the glass casing were sealed to the peripheral portion of the substrate (to enclose the OXRD imager) using a sealant in a similar fashion as shown in FIG. 9.

Example 3: Packaging of an OXRD Imager in a Casing with Evacuation

An OXRD imager fabricated as explained above was packaged by enclosing the OXRD imager using a glass casing having a hole in a wall (similar to as shown in FIG. 6 or FIG. 7). The glass casing was sealed using a sealant to the substrate in a similar fashion as shown in FIG. 9 or FIG. 10. After enclosing the OXRD imager in a volume inside the glass casing, the volume was evacuated using a vacuum pump through the hole. The pressure inside the glass casing was lowered to less than 1 Torr. The evacuated volume was immediately filled with nitrogen. Following nitrogen filling, the hole was sealed using the sealant (similar to as shown in FIG. 11) to maintain the nitrogen atmosphere inside the glass casing of the packaged OXRD imager.

Testing of Packaged OXRD Imagers

Performance of the packaged OXRD imagers were characterized using an imager functional tester under same timing mode. The resulting defect maps of the packaged OXRD imagers were compared. Defect maps are typically received based on the electrical performance of the packaged OXRD imager. Packaged OXRD imagers of example 1, 2, and 3 were characterized by observing defect maps (FIGS. 15, 16 and 17) received using functional tester measurements performed on as-formed packaged OXRD imagers and after a period of time. The dark areas in the defect maps showed high dark current that correspond to defective pixels. These defective pixels may be caused by oxygen and moisture penetration through a pinhole in the barrier layer.

Figure 15:
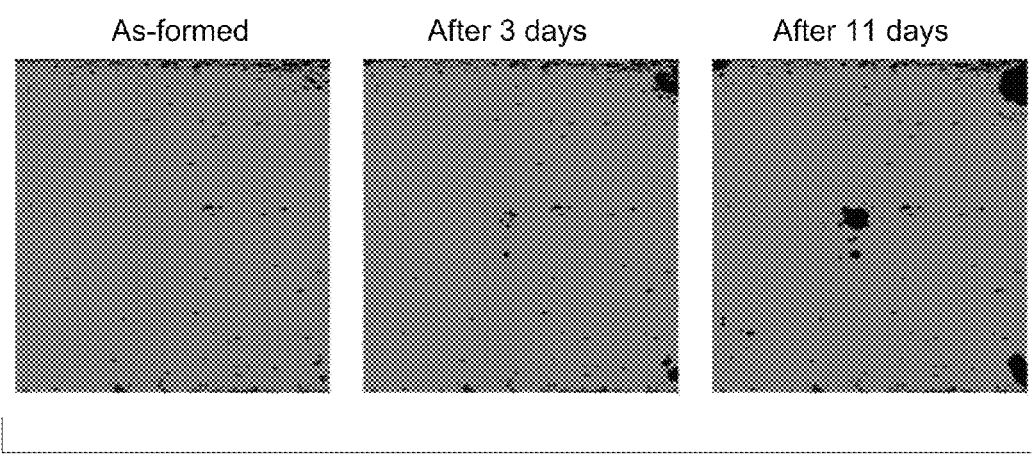
FIG. 15 shows defect maps of an organic x-ray detector imager that was packaged without a casing.

FIG. 15 shows defects maps of the packaged OXRD imager of example 1, observed immediately after packaging the OXRD imager (i.e., as-formed), after 3 days, and after 11 days. The defect maps after 3 days and 11 days had more dark area as compared to the defect map of as-formed packaged OXRD imager. That means that the electrical performance of the packaged OXRD imager of example 1 degraded significantly in 11 days. This fast degradation may be because of the direct exposure of the OXRD imager of example 1 to atmospheric oxygen and moisture that affected the electrical performance of the packaged OXRD imager of example 1 in a short time.

Figure 16:
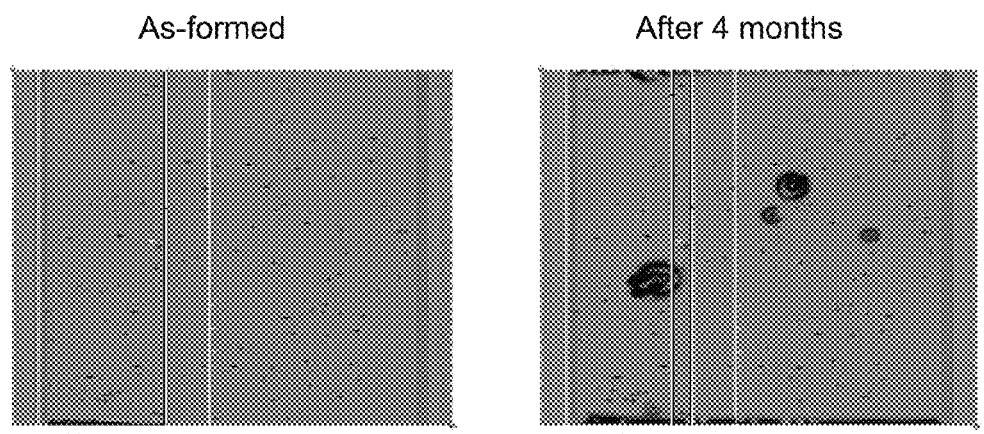
FIG. 16 shows defect maps of an organic x-ray detector imager that was packaged using a conventional method.

FIG. 16 shows defects maps of the packaged OXRD imager of example 2, observed immediately after packaging the OXRD imager (i.e., as-formed) and after four months. The defect map after four months showed significant dark areas, which means that the electrical performance of the packaged OXRD imager degraded significantly in four months. Since the packaged OXRD imager of example 2 contained air inside the glass casing, the OXRD imager was exposed to some amount of oxygen and moisture that affected the electrical performance of the packaged OXRD imager of example 2.

Figure 17:
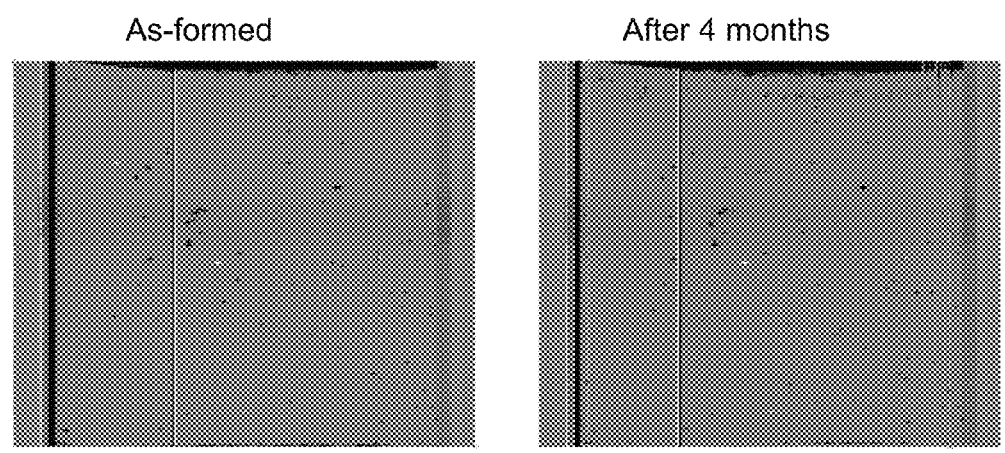
FIG. 17 shows defect map of an organic x-ray detector imager that was packaged using a method in accordance with one embodiment of the invention.

FIG. 17 shows defects maps of the packaged OXRD imager of example 3, observed immediately after packaging the OXRD imager (i.e., as-formed) and after four months. The defect map after four months looked similar to the defect map of as-formed packaged OXRD imager. That is, the electrical performance of the packaged OXRD imager of example 3 was consistent for at least four months. As the packaged OXRD imager of example 3 was not exposed to oxygen and moisture, the electrical performance of the packaged OXRD imager of example 3 did not degrade in four months.

Thus, the packaged OXRD imager of example 3 showed improved electrical performance as compared to the packaged OXRD imagers of examples 1 and 2. This improved electrical performance may be due, in part, to negligible exposure of the organic photodiode to oxygen and moisture during the four months' period.

While only certain features of the disclosure have been illustrated and described herein, many modifications and changes will occur to those skilled in the art. It is, therefore, to be understood that the appended claims are intended to cover all such modifications and changes as fall within the true spirit of the invention.

The invention claimed is:

1. A method for packaging an organic photodetector, comprising:
   providing a multilayer structure disposed on a portion of a substrate to form the organic photodetector; wherein the multilayer structure comprises:
   a thin film transistor (TFT) array;
   an organic photodiode disposed on the TFT array; and
   a scintillator layer disposed on the organic photodiode;
   providing a casing having at least one wall and an open end, wherein the casing comprises at least one aperture in the at least one wall;
   sealing the open end of the casing with the substrate to enclose the multilayer structure in a volume such that the least one aperture is located in a path of radiation to an inactive region of the organic photodetector;
   evacuating the volume through the at least one aperture; and
   closing the at least one aperture after evacuating the volume to form a detector package.

2. The method according to claim 1, wherein the volume is evacuated to a vacuum level less than 1 Torr.

3. The method according to claim 1, further comprises disposing an inert gas in the evacuated volume through the at least one aperture.

4. The method according to claim 3, wherein the casing comprises two apertures in the at least one wall, and wherein the step of evacuating the volume is carried out through one aperture and disposing the inert gas into the volume is carried out through another aperture.

5. The method according to claim 1, wherein the step of closing the at least one aperture comprises sealing the at least one aperture using a sealant, a cover, or a combination thereof.

6. The method according to claim 5, wherein the sealant comprises an encapsulant selected from the group consisting of a low temperature glass, low temperature metal, epoxy, acrylate and combinations thereof.

7. The method according to claim 5, wherein the aperture is sealed by laser ablation.

8. The method according to claim 1, wherein the open end of the casing is sealed to the substrate by bonding a peripheral edge of the open end of the casing to a peripheral portion of the substrate, which is free of the multilayer structure.

9. The method according to claim 1, wherein the organic photodiode comprises:
   a first electrode;
   an organic photoactive layer disposed on the first electrode; and
   a second electrode disposed on the organic photoactive layer.

10. The method according to claim 1, wherein the scintillator layer comprises cesium iodide, terbium-activated gadolinium oxysulfide, sodium iodide, lutetium oxides, or combinations thereof.

11. An imaging system comprising the detector package in accordance with claim 1.

\* \* \* \* \*